United States Patent [19]

Hata

[11] Patent Number: 4,731,602

[45] Date of Patent: Mar. 15, 1988

[54] CONVERTER

[75] Inventor: Ikuro Hata, Kanagawa, Japan

[73] Assignee: Sony Corporation, Tokyo, Japan

[21] Appl. No.: 910,518

[22] Filed: Sep. 23, 1986

[30] Foreign Application Priority Data

Sep. 24, 1985 [JP] Japan ............................ 60-210763

[51] Int. Cl.⁴ .............................................. H03M 1/50
[52] U.S. Cl. ...................... 340/347 MT; 340/347 AD
[58] Field of Search .................. 340/347 AD, 347 NT

[56] References Cited

U.S. PATENT DOCUMENTS 3,582,947  6/1971  Harrison ........................ 340/347 NT
3,624,500 11/1971  Patzelt .......................... 340/347 NT
4,125,896 11/1978  Metcalf ......................... 340/347 NT
4,404,546  9/1983  Hata et al. ..................... 340/347 DA

OTHER PUBLICATIONS

Aasnaes, "Electronics", Apr. 29, 1968, pp. 70–72.

Primary Examiner—Charles D. Miller
Attorney, Agent, or Firm—Lewis H. Eslinger; Alvin Sinderbrand

[57] ABSTRACT

An analog-to-digital or digital-to-analog converter comprises: a signal input terminal an integrator connected to the signal input terminal; a plurality of constant current sources connected to the integrator so that the integrator is supplied with respective constant currents; a first counter having a first predetermined number of bits for higher significant bits and a second counter having a second predetermined number of bits for lower significant bits; and a clock signal generator for generating a first clock signal having a first clock frequency and being supplied to the first counter and a second clock signal having a second frequency higher than the first clock frequency and being supplied to the second counter; and currents of the plurality of constant current sources are respectively determined according to the first and second predetermined numbers of bits and the first and second clock frequencies of the first and second clock signals, respectively.

8 Claims, 14 Drawing Figures

FIG. 2A
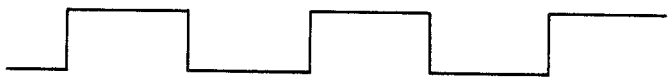
FIG. 2B
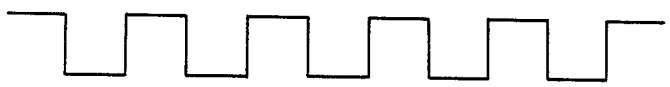
FIG. 2C
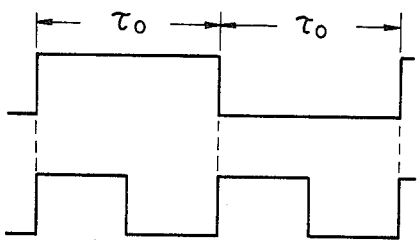
FIG. 4A
FIG. 4B
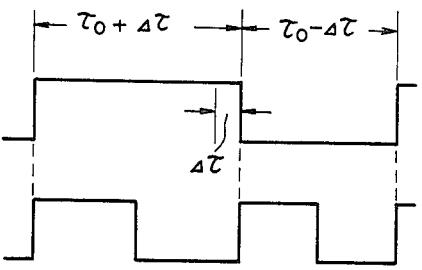
FIG. 5A
FIG. 5B

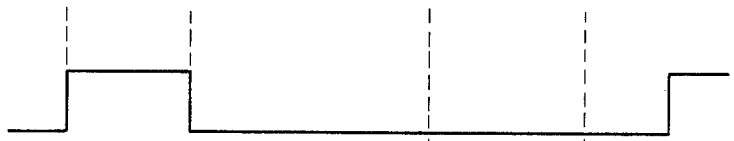
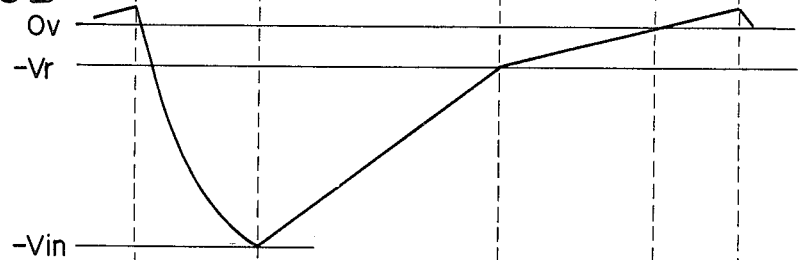
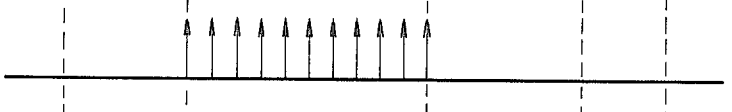

CONVERTER

BACKGROUND OF THE INVENTION

The present invention relates to an integral-type A/D or D/A converter.

As an example of A/D converters, there has been known the integral-type A/D converter. In this integral-type A/D converter, an analog input signal is fed via a sampling switchelement to an integrator which consists of an operational amplifier and a capacitor. At the moment when the switch element is closed, the capacitor starts charging to the input voltage. The capacitor is connected with two constant current sources providing different supply currents through respective switches. At a time point when the sampling switch element is opened, the constant current sources have their switches closed, and the capacitor is discharged by the constant current sources. The two constant current sources provide currents $I_o$ and $i_o$, which are set in magnitude to be, for example, $I_o:i_o 2^7:1$ or 128:1. Initially, the switch associated with the source of current $I_o$ is closed, causing the capacitor to start discharging, and the discharging time length until the capacitor voltage becomes the predetermined value is measured by an upper-bits counter. Subsequently, the switch associated with the source of current $I_o$ is opened and at the same time the switch associated with the source of current $i_o$ is closed, and the capacitor continues discharging until its voltage falls to zero volts, and the discharging time length is measured by a lower-bits counter. The count values left in the upper and lower bits counters in combination represent a 16-bit digital value as a result of A/D conversion for the input analog signal. The foregoing A/D converter is described in U.S. patent application Ser. No. 556,710 (filed on Nov. 25, 1983) by the applicant of the present invention, and a D/A converter using the same principle is described in U.S. Pat. No. 4,404,546 and U.S. patent application Ser. No. 432,845 (filed on Oct. 5, 1982).

The foregoing conventional A/D converter operates at a conversion speed which is determined from the length of time after the upper 9-bit counter has started counting until the lower 7-bit counter ends the count operation. The upper 9-bit counter has a count capacity of $2^9$ (i.e., 512), while the lower 7-bit counter has a count capacity of $2^7$ (i.e., 128). Accordingly, the total count capacity of the upper 9-bit counter and lower 7-bit counter is 640. For a given sampling frequency of 48 kHz, for example, 640 counts must be completed in each sampling period. If it is intended to implement A/D conversion for two channels alternately on a time division basis, the clock generator needs to produce a master clock at a frequency: $fm_1 = 2ch \times 48 kHz \times 640 = 61.44$ MHz.

In quantizing an input analog audio signal at a sampling frequency fs, it is necessary to confine the input analog signal within the band of fs using an analog low-pass filter in order to suppress the foldover (aliasing) noise created with the center at the sampling frequency fs. To achieve satisfactory characteristics up to a higher frequency region, the low-pass filter needs to have a sharp response curve, which, however, is difficult to realize using an analog low-pass filter.

In quantizing an input analog audio signal in a digital audio tape recorder, for example, a conceivable scheme is that the input signal is confined in a band of fs using an analog low-pass filter and, after it has been quantized at a doubled sampling frequency 2fs, it is finally confined in a band of fs using a digital filter. Namely, through the quantization process at a frequency twice the sampling frequency fs, quantization up to the band of fs is made possible based on the sampling theory. Since the band necessary for the sampling at frequency fs is up to a fs frequency, the use of a sharp digital low-pass filter tuned to the fs frequency eliminates the need of a sharp response for the analog low pass filter. A digital filter having a sharp response is more readily realized than an analog filter. On this account, through the quantization at a 2fs frequency and band limitation using a digital filter, satisfactory operating characteristics up to a high frequency region can be accomplished at a low cost.

In the above case of quantizing an input analog signal at a frequency twice the sampling frequency fs, the A/D converter needs to operate at a speed twice as fast as the case of quantization at the frequency fs.

For carrying out A/D conversion at a 2fs frequency which is twice as high as the sampling frequency fs using the foregoing conventional A/D converter, the master clock frequency fm required is doubled to $2 \times 2ch \times 48 kHz \times 640 = 122.88$ MHz. The master clock generator uses a crystal resonator, but it is difficult to have a stable master clock oscillation at such a high frequency using a crystal resonator.

SUMMARY OF THE INVENTION

Accordingly, it is an object of the present invention to provide an A/D or D/A converter which is operative at an increased conversion speed.

Another object of this invention is to provide an A/D or D/A converter which can reduce the disparity of the current ratio when the converter is fabricated in an integrated circuit, through the provision of a smaller ratio for the reference current sources.

The present invention resides in an analog-to-digital or digital to analog converter comprising: a signal input terminal an integrator connected to the signal input terminal; a plurality of constant current sources connected to the integrator so that the integrator is supplied with respective constant currents; counter means including a first counter having a first predetermined number of bits for higher significant bits and a second counter having a second predetermined number of bits for lower significant bits; and clock signal generating means for generating a first clock signal having a first clock frequency and supplied to the first counter and a second clock signal having a second frequency higher than the first clock frequency and supplied to the second counter; respective currents of the plurality of constant current sources are determined according to the first and second predetermined numbers of bits and the first and second clock frequencies of the first and second clock signals, respectively.

BRIEF DESCRIPTION OF THE DRAWINGS

FIG. 2 is a waveform diagram used to explain the generation of a clock having a double frequency according to the embodiment;

FIG. 3 is a waveform diagram used to explain the operation of the embodiment; and FIGS. 4 and 5 are waveform diagrams used to explain the embodiment of this invention.

DESCRIPTION OF THE PREFERRED EMBODIMENT

Figure 1:
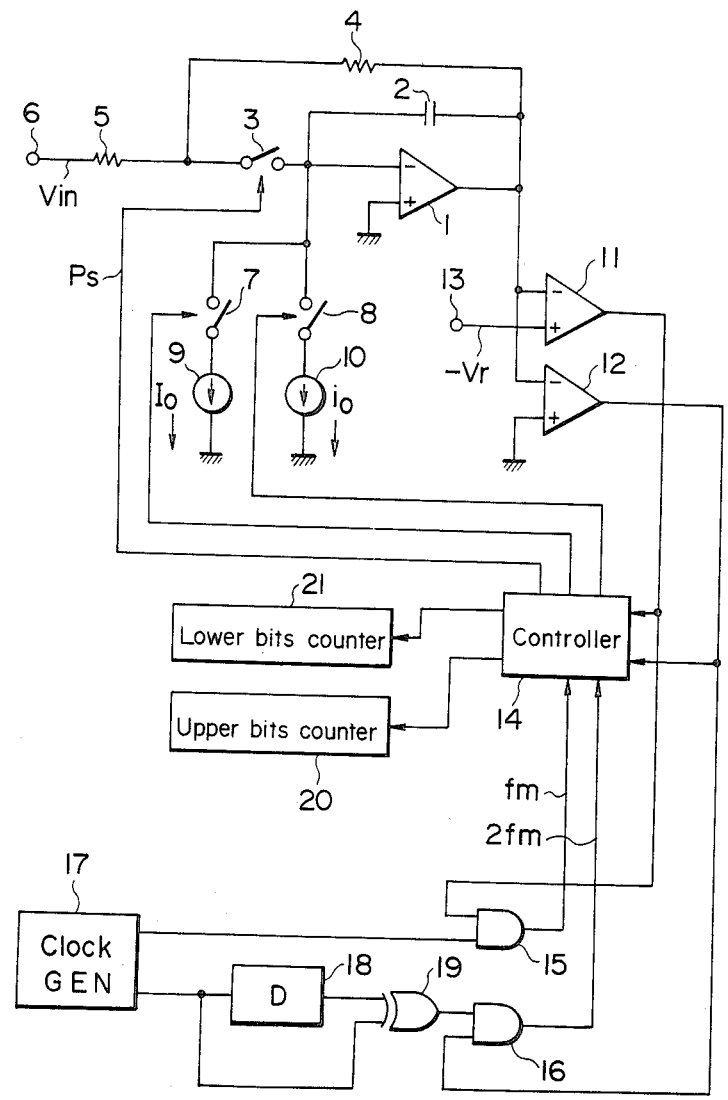
FIG. 1 is a block diagram showing an embodiment of this invention.

An embodiment of this invention will now be described with reference to the drawings.

In FIG. 1, an operational amplifier 1 has an associated capacitor 2 connected between its inverting input terminal and output terminal, and an integrator is formed by these components. The output terminal of the operational amplifier 1 is connected through a resistor 4 to one end of a resistor 5, which has another end connected to the input terminal 6 of the converter. The resistors 4 and 5 have their common end connected via a switch circuit 3 to the inverting input terminal of the operational amplifier 1. The non-inverting input terminal of the operational amplifier 1 is grounded. The inverting input terminal of the operational amplifier 1 is connected to one terminal of a current source 9 providing a current value $I_o$ and another current source 10 providing a current value $i_o$ through switch circuits 7 and 8, respectively. Another terminal of each of the current sources 9 and 10 is grounded.

The switch circuit 3 is controlled by sampling pulses Ps from a control circuit 14. When the switch circuit 3 is closed in response to a sampling pulse Ps, the input analog signal at the input terminal 6 is sampled and held in such a way that the capacitor 2 is charged to the input voltage Vin. When the switch circuit 3 is made open, the capacitor 2 is discharged by means of the current sources 9 and 10. The switch circuits 7 and 8 are controlled by a control circuit 14 so that the capacitor 2 is first discharged to a certain voltage level by the current source 9 of $I_o$ and then discharged successively by the current source 10 of $i_o$. The current sources 9 and 10 have their current values $I_o$ and $i_o$ preset to have a relation $I_o/i_o = 128$.

The operational amplifier 1 has its output voltage delivered to comparators 11 and 12. The comparator 11 is supplied with a reference voltage $-Vr$ through the terminal 13, and it compares the output of the operational amplifier 1 with the reference voltage $-Vr$. The comparator 12 has another input terminal grounded, and it compares the output of the operational amplifier 1 with the ground level. The comparators 11 and 12 have their comparison outputs delivered to the control circuit 14, and at the same time they are applied to first inputs of AND gates 15 and 16, respectively.

A clock generating circuit 17 produces a master clock at a frequency of fm, and it is applied to another or second input of the AND gate 15. Since the AND gate 15 receives the output of the comparator 11 at one input, it passes the fm clock provided by the clock generating circuit 17 on to the control circuit 14 when the output of the comparator 11 is high. During the period when the comparator 11 provides a high output, the switch circuit 7 is closed and the fm clock is supplied through AND gate 15 to the control circit 14 so that an upper 8-bit counter 20 operates to count the clock.

The clock at frequency fm provided by the clock generating circuit 17 is also delivered directly to one input terminal of an exclusive-OR gate 19 and at the same time is applied to another input terminal of the exclusive-OR gate 19 through a delay circuit 18. By such application of the fm clock (FIG. 2A) to one input terminal of the exclusive-OR gate 19 and the delayed fm clock (FIG. 2B) to another input terminal, the exclusive-OR gate 19 produces a clock at frequency 2fm (FIG. 2C) at its output terminal connected to AND gate 16.

Since AND gate 16 receives at its one input terminal the output of the comparator 12, it passes the 2fm clock provided by the exclusive-OR gate 19 on to the control circuit 14 when the output of the comparator 12 is high. During the period when the comparator 12 provides a high output, the switch circuit 8 is closed and the 2fm clock is supplied to the control circuit 14 so that a lower 8-bit counter 21 operates to count the clock.

The operation of the foregoing embodiment will further be described with reference to FIG. 3. When a sampling pulse Ps having an active period of $t_0$ to $t_1$ as shown in FIG. 3A is supplied from the control circuit 14 to the switch circuit 3, the switch circuit 3 is closed, causing the input analog signal at the input terminal 6 to be sampled and held, and the output voltage of the operational amplifier 1 falls to an extent depending on the voltage level of the input analog audio signal, as shown in FIG. 3B. When the sampling pulse Ps falls at time point $t_1$ as shown in FIG. 3A, the switch circuit 3 opens, causing the switch circuit 7 to close as shown in FIG. 3C, and at the same time the upper 8-bit counter 20 starts counting as shown in FIG. 3E. In response to the closure of the switch circuit 7, the capacitor 2 which has been charged by the $I_o$ current source 9 is discharged, and consequently the output of the operational amplifier 1 increases as shown in FIG. 3B. At the same time, the upper 8-bit counter 20 counts the clock having a frequency of fm, as shown in FIG. 3E.

When the output of the operational amplifier 1 has fallen down to the reference voltage $-Vr$, the comparator 11 produces a low output. At time point $t_2$ when the output of the comparator 11 goes low, the switch circuit 7 is opened and the switch circuit 8 is closed. Then, the upper 8-bit counter 20 ceases counting as shown in FIG. 3E, and the lower 8-bit counter 21 starts counting as shown in FIG. 3F. In response to the closure of the switch circuit 8 as shown in FIG. 3D, the capacitor 2 is discharged gradually by way of the $i_o$ current source 10, and the output of the operational amplifier 1 rises gradually as shown in FIG. 3C. At the same time, the lower 8-bit counter 21 counts the clock of the 2fm frequency as shown in FIG. 3F. When the output of the operational amplifier 1 has risen up to 0 volt, the comparator 12 provides a low output, and at time point $t_3$ when the output of the comparator 12 goes low the lower 8-bit counter 21 ceases counting.

The current values $I_o$ and $i_o$ produced by the current sources 9 and 10 are set to have the following relationship.

$$I_o/i_o = 128 \; (=2^7)$$

The lower 8-bit counter 21 operates at 2fm, twice the master clock frequency fm, and therefore, equivalently, the lower 8-bit counter 21 is weighted by $2^8$ for each count with respect to a count of the upper 8-bit counter 20. Accordingly, a serial connection of the upper 8-bit counter 20 and lower 8-bit counter 21 provides 16-bit conversion data.

Despite the change in the proportion of the numbers of upper and lower bits of counters from the upper 9 bits and lower 7 bits in the aforementioned conventional A/D converter to the upper 8 bits and lower 8 bits, the lower bit counter 21 operates to count the frequency 2fm, and therefore the current ratio $I_o/i_o$ can be set equal to the case of the conventional A/D converter.

Since the lower 8-bit counter 21 operates to count the frequency 2fm, that is, twice the master clock frequency fm, in this embodiment, the conversion speed can be increased without raising the master clock frequency. More specifically, the conversion speed is determined from the time length after the upper 8-bit counter 20 has started counting until the lower 8-bit counter 21 ceases counting. The upper 8-bit counter 20 counts up to 256, while the lower 8-bit counter 21, which counts the 2fm clock, counts up to 128 in terms of the master clock. Accordingly, the total number of counts by the upper 8-bit count 20 and lower 8-bit counter 21 is 384 in terms of the master clock. For the 2-channel A/D conversion at a frequency twice the sampling frequency fs of 48 kHz, for example, the master frequency fm required is given as: fm=2×2ch×48 kHz×384=73.728 MHz. Accordingly, the high-speed converting operation is made possible without the need to provide a much higher master clock frequency fm.

In case the bits are divided into upper 9 bits and lower 7 bits as in the conventional A/D converter, the master clock frequency fm required is given as: fm=2×2 ch×48 kHz×576=110.592 MHz, which is far higher than that of the above higher 8-bit and lower 8-bit bit division. On this account, when the lower-bits counter 21 is intended to operate at a frequency 2fm, twice the master clock frequency fm, a higher converting speed is achieved through the bit division of higher 8-bit and lower 8-bit configuration than in the case of the conventional scheme. In the other case of bit division into upper 9 bits and lower 7 bits, the current sources 9 and 10 have a smaller current ratio of 64:1, which will result in a smaller disparity of current ratio when the converter is fabricated in an integrated circuit.

It is also possible to speed up the converting operation by supplying the 2fm clock frequency provided by the exclusive-OR gate 19 to the upper 8-bit counter 20 in addition to the lower 8-bit counter 21. However, it is not easy for the clock generating circuit 17 to produce a clock always with an exact duty cycle of 50%. Variation in the duty cycle of the master clock creates error because of an inconsistent conversion ratio. This error is more serious for higher-order bits.

When the upper 8-bit counter 20 is operated at the frequency 2fm, the current value to be supplied by the current source 9 is $2I_o$. Accordingly, the variation of the level in the range $\tau_o$ of master clock with a 50% duty cycle, as shown in FIG. 4, is given as:

$$\frac{2I_o}{C} \cdot \frac{\tau_o}{2} = \frac{I_o}{C} \tau_o$$

If the duty cycle varies by $\Delta\tau$ as shown in FIG. 5, $$\frac{2I_o}{C} \cdot \frac{\tau_o + \Delta\tau}{2} = \frac{I_o}{C} \tau_o + \frac{I_o}{C} \Delta\tau$$

The result is an error by the amount of $(I_o/C)\Delta\tau$. the variation in the level of the lower 8-bit counter 21 is given as:

$$\frac{2i_o}{C} \cdot \frac{\tau_o}{2} = \frac{i_o}{C} \tau_o$$

If the variation of the level caused by the change in the duty cycle is greater than the LSB of the lower 8-bit counter 21, i.e., $i_o\tau_o > I_o\Delta\tau$, it will pose a problem. For example, when setting is made as $I_o/i_o = 256$, the duty cycle must not vary by 1/256 or more.

Although an embodiment of the A/D converter has been described, the present invention can equally be applied to an integral-type D/A converter.

According to the present invention, the lower-bits counter operates at a clock frequency twice the master clock frequency, which allows an increased conversion speed without raising the master clock frequency. As a result, the quantizing operation at the frequency 2fs, that is, twice the sampling frequency fs, which has been implemented conventionally using a master clock of 122.88 MHz, for example, is now made possible using a master clock as low as 73.728 MHz, for example. In addition, setting the clock for the lower-bits counter to be twice the master clock frequency allows a smaller ratio of supply currents, whereby the disparity of the current ratio can be minimized when the converter is fabricated in an integrated circuit.

What is claimed is:

1. An analog-to-digital converter comprising:
   a signal input terminal;
   an integrator connected to said signal input terminal;
   a plurality of constant current sources connected to said integrator so that said integrator is supplied with respective constant currents;
   counter means including a first counter having a first predetermined number of bits for higher significant bits and a second counter having a second predetermined number of bits for lower significant bits; and
   clock signal generating means for generating a first clock signal having a first clock frequency and being supplied to said first counter and a second clock signal having a second frequency higher than said first clock frequency and being supplied to said second counter;
   said plurality of constant current sources having respective currents which are determined according to said first and second predetermined numbers of bits and said first and second clock frequencies of said first and second clock signals, respectively.

2. An analog-to-digital converter according to claim 1, wherein said clock signal generating means comprises a master clock generating means for generating said first clock signal and frequency doubler means for generating said second clock signal from said first clock signal.

3. An analog-to-digital converter according to claim 2, wherein said first and second predetermined numbers of bits are equal to each other.

4. An analog-to-digital converter comprising:
   an analog signal input terminal;
   a first switching means;
   a second switching means;
   a third switching means;
   an integrator connected to said analog signal input terminal through said first switching means and having an output;
   comparator means including a first comparator having a first input terminal connected to said output of the integrator and a second input terminal connected to a first reference voltage source, and a second comparator having a first input terminal connected to said output of said integrator and a second input terminal connected to a second reference voltage source;
   counter means including a first counter having a first predetermined number of bits for higher significant bits and a second counter having a second predetermined number of bits for lower significant bits;

clock signal generating means for generating a first clock signal having a first clock frequency and being supplied to said first counter and a second clock signal having a second frequency higher than said first clock frequency and being supplied to said second counter;

a plurality of constant current sources connected to said integrator through said second and third switching means, respectively, so that said integrator is supplied with respective constant currents determined according to said first and second predetermined numbers of bits and said first and second clock frequencies of said first and second clock signals, respectively; and control means for controlling said first, second and third switching means and said counter means in response to said clock signal generating means and said comparator means.

5. An analog-to-digital converter according to claim 1, wherein said first and second predetermined numbers of bits are equal to each other.

6. A converter for converting an input signal of a first type to a corresponding output signal of a second type, said converter comprising:

signal input terminal means receiving said input signal of the first type;

an integrator operative in accordance with said input signal;

a plurality of constant current sources connected to said integrator so that said integrator is supplied with respective constant currents;

counter means including a first counter having a first predetermined number of bits for higher significant bits and a second counter having a second predetermined number of bits for lower significant bits; and clock signal generating means for generating a first clock signal having a first clock frequency and being supplied to said first counter and a second clock signal having a second clock frequency higher than said first clock frequency and being supplied to said second counter;

said plurality of constant current sources having respective currents which are determined according to said first and second predetermined numbers of bits and said first and second clock frequencies of said first and second clock signals, respectively.

7. A converter according to claim 6, wherein said clock signal generating means comprises a master clock generating means for generating said first clock signal and frequency doubler means for generating said second clock signal from said first clock signal.

8. A converter according to claim 7, wherein said first and second predetermined numbers of bits are equal to each other.

* * * * *

UNITED STATES PATENT AND TRADEMARK OFFICE
CERTIFICATE OF CORRECTION

PATENT NO. : 4,731,602
DATED : March 15, 1988
INVENTOR(S) : Ikuru Hata

It is certified that error appears in the above-identified patent and that said Letters Patent are hereby corrected as shown below:

Column 1, line 10 change "switchelement" to --switch element--;

Column 1, line 35 , 36 and 39 change "patent application" to -- Patent Application --.

Column 7, line 22 change "1" to --3--.

Signed and Sealed this

Fourth Day of October, 1988

Attest:

DONALD J. QUIGG

*Attesting Officer*     *Commissioner of Patents and Trademarks*